United States Patent [19]

Kurafuchi et al.

[11] Patent Number: 5,672,965

[45] Date of Patent: Sep. 30, 1997

[54] EVALUATION BOARD FOR EVALUATING ELECTRICAL CHARACTERISTICS OF AN IC PACKAGE

[75] Inventors: Kazuhiko Kurafuchi; Hiroshi Seki, both of Kikuchi-gun; Mitsuyuki Takada, Amagasaki, all of Japan

[73] Assignee: Mitsubishi Denki Kabushiki Kaisha, Tokyo, Japan

[21] Appl. No.: 476,248

[22] Filed: Jun. 7, 1995

[30] Foreign Application Priority Data

Jun. 14, 1994 [JP] Japan ..................... 6-131776

[51] Int. Cl.⁶ .................. G01R 1/06; G01R 1/07
[52] U.S. Cl. ..................... 324/158.1; 324/757
[58] Field of Search ..................... 324/158.1, 73.1, 324/751, 754, 756, 757; 439/66

[56] References Cited

U.S. PATENT DOCUMENTS 5,389,873  2/1995  Ishii et al. ..................... 324/158.1

FOREIGN PATENT DOCUMENTS 4-27874  1/1992  Japan.

OTHER PUBLICATIONS

"Package Test Fixture" from Catalog of Cascade Microtech, 1991 (month not present).

*Primary Examiner*—Kenneth A. Wieder
*Assistant Examiner*—Barry C. Bowser
*Attorney, Agent, or Firm*—Leydig, Voit & Mayer

[57] ABSTRACT

An evaluation board for evaluating electrical characteristics of an IC package has an electrically insulating support board having signal wire patterns for contact by a measurement probe formed on a first surface and mounting pads for contact with solder balls of an IC package formed on a surface. The signal wire patterns and the mounting pads are electrically connected with each other via through holes formed in the support board. The signal wire patterns are surrounded by and spaced from a ground pattern formed on the first surface.

12 Claims, 12 Drawing Sheets

EVALUATION BOARD FOR EVALUATING ELECTRICAL CHARACTERISTICS OF AN IC PACKAGE

BACKGROUND OF THE INVENTION

1. Field of the Invention

The present invention relates to an evaluation board for evaluation of electrical characteristics such as high-frequency characteristics of IC packages such as a BGA (Ball Grid Array) package having multiple pins and a narrow pitch.

2. Description of the Related Art

FIG. 14 shows a conventional evaluation board for evaluating electrical characteristics. A process for producing this type of evaluation board (test board) 7 is, first of all, plating on a side (hereinafter: face) of a support board such as a glass epoxy board. After that, patterns 1 and 2 are formed in array by etching and the like. Furthermore, a through-hole 8 is formed at a center portion of each of arrayed patterns 1 with a laser and the like. The diameter of this through-hole 8 is at least the size that a pin that is an external terminal of a package can be inserted.

In FIG. 14, the reference numeral 1 shows a pattern used for a signal line, the pattern having four convex portions 1a i.e., projections extending in four directions for contacting of a head (reference numeral 4a in FIG. 15) of a probe terminal (reference numeral 4 in FIG. 15). This convex portion 1a is nearly 150–250 µm-long and nearly 100–200 µm-wide. In addition, the reference numeral 2 shows a pattern used as a ground, the pattern being a widespread pattern having predetermined gaps with patterns 1. Moreover, the other surface (hereinafter: back face) of this conventional test board 7 is not processed, and does not have patterned portion.

FIG. 16 is a cross-sectional view showing a measuring method for measuring electrical characteristics of a PGA (Pin Grid Array) package, which is a pin insertion type, by use of a conventional test board 7 that is described above. In case of measuring a PGA package 5, as shown in FIG. 16, first of all, a microstrip board 5b that has patterns formed on a support ceramic board and the like and has a resistance of nearly 50 Ω is mounted on the PGA package 5. Further, external terminals (pins) 6 of the PGA package 5 are inserted from the back face of the test board 7 into the through-holes 8 of the conventional test board 7. Thereafter, on the surface of the test board 7, these external terminals 6 are connected to signal wire patterns 1 used for measurement with electroconductive materials such as solder or silver solder. Moreover, as shown in FIG. 15, a head 4a of the probe terminal 4 for measuring electrical characteristics is contacted to a convex portion 1a of the signal wire pattern 1 and a ground pattern 2 for measurement. For example, in case of measuring transmission characteristics of the PGA package 5, as shown in FIG. 16, the left probe terminal 4 that is set as an input terminal is connected to the right probe terminal 4 that is set as an output terminal. In addition, the input and output terminals can be exchanged each other.

Then, by using an LRM (Line-Reflect-Match) calibration with which calibration can be done at the head tip of the probe terminal 4, the electrical characteristics of only the PGA package 5 can be obtained. However, a method for measurement by inserting pins from the back face of the conventional test board 7 has a problem that this method cannot be used for area-array types of packages for surface mounting, which are soldered on a board through solder balls instead of pins, such as a BGA package and the like that have been spreading widely and steeply.

Therefore, in order to measure the BGA packages having no insertion terminals, by using another conventional evaluation board 7A, a method shown in FIG. 17 and FIG. 18 has been used. Thus, as shown in FIG. 17 and FIG. 18, a BGA package 9 on which a microstrip board 9b whose electrical characteristics are known beforehand is mounted is prepared. Then, solder balls 9a of the BGA package 9 are connected to the signal wire patterns 1A of the test board 7A. In addition, the head tips of the probe terminals 4 are contacted to the above-described signal wire pattern 1A and the continuous line 10 for measurement. However, by this method, the probe terminal 4 can contact only the line 10 of the test board 7A which is not covered by the above-described BGA package 9 (FIG. 17). Accordingly, the distance L between the above-described solder ball 9A on the signal wire pattern 1A and the contact portion of the head tip of the above-described probe terminal 4 becomes long. Therefore, depending on the above-described LRM calibration, only the characteristics generated through adding characteristics of the line 10 and the BGA package 9 can be obtained. In this case, it is difficult to obtain the pure characteristics of the BGA package 9 (there is a method for obtaining it through complex calculation). However, it is theoretically possible to obtain the pure characteristics of the BGA package 9 by placing a calibration surface at the "A" portion in FIG. 17 through adopting TRL (Thru-Reflect-Line) calibration. In the TRL calibration, it is necessary correctly to grasp the characteristics of the line 10 in a full frequency range as known values. Actually, in the TRL calibration, many measurement errors cannot help being included due to production difficulty of such a line (microstrip-coplanar), and consequently, highly precisional measurement is difficult.

Furthermore, in a conventional test board 7 shown in FIG. 14, a pitch PA of arrayed signal wire patterns 1, each of which has convex portions 1a extending toward four directions, is now 2.54 mm. In general, the necessary length of the convex portion 1a of the signal wire pattern 1 shown in FIG. 14 is at least 100 µm so that a probe terminal 4 may contact for measurement: if it is less than the value, measurement becomes impossible. However, recently, in company with pitch-narrowing of terminals of IC packages, it becomes necessary that a pitch of the above-described signal wire patterns 1A, which are arrayed, is equal to or less than 1.27 mm or less, that is, 1.00 mm. In that case, it becomes difficult to secure the length of the above-described convex portions 1a in four directions to be equal to or more than 100 µm. Therefore, the conventional test board 7 has another problem that it can not correspond to pitch-narrowing of IC packages to be evaluated.

SUMMARY OF THE INVENTION

An object of the present invention is to provide an evaluation board with which the electrical characteristics of BGA packages that have not insertion terminals can be easily measured.

In addition, another object of the present invention is to provide an evaluation board with which the electrical characteristics of BGA packages can be measured only with LRM calibration that enables calibration to be highly precisional and easy.

Furthermore, a further object of the present invention is to provide an evaluation board that can correspond to pitch-narrowing of IC packages such as a BGA package and the like to be evaluated.

An evaluation board according to the present invention comprises a measurement pattern formed on a surface of a support board, a pattern for package mounting, which is formed on the other surface of the support board, and electroconductive means for connecting the above-described two patterns each other through through-holes electrically.

In addition, in the present invention, plugged portions that the above-described through-holes are plugged are prepared.

Furthermore, in the present invention, as the above-described pattern for package mounting, pads for package mounting are formed on the above-described plugged-portions.

Moreover, in the present invention, convex portions i.e., projections, of each signal wire pattern included in the above-described measuring pattern, the convex portions being used for contacting of probe terminals, are formed in directions as the convex portions approach to two edges that are comparatively near among four edges of the above-described board, and are composed of only two convex portions extending toward the directions perpendicular to these two edges.

Further, in the present invention, in each signal wire pattern included in the above-described measurement pattern, at least one convex portion for contacting of a probe terminal is formed, the convex portion that is formed in a direction as the convex portion approaches to an edge that is comparatively near among four edges of the above-described board, and extends toward the direction forming a predetermined angle in the range of 30°–60° with this edge.

Furthermore, in the present invention, convex portions of each signal wire pattern included in the above-described measuring pattern, the convex portions being used for contacting of probe terminals, are formed in directions as the convex portions approach to two edges that are comparatively near among four edges of the above-described board, and are composed of only two convex portions extending toward the directions forming predetermined angles with these two edges.

According to the present invention, a support pattern for package mounting is formed on the back face of a board, and this pattern is connected to the support measurement pattern on the face of the board through though-holes electrically. Therefore, even a package having no insertion terminal such as a BGA package can be measured on its electrical characteristics by mounting the package on the back face of the support board and contacting a head of a probe terminal 4 to the measurement pattern.

DETAILED DESCRIPTION OF THE PREFERRED EMBODIMENTS

Embodiment 1

Figure 1:
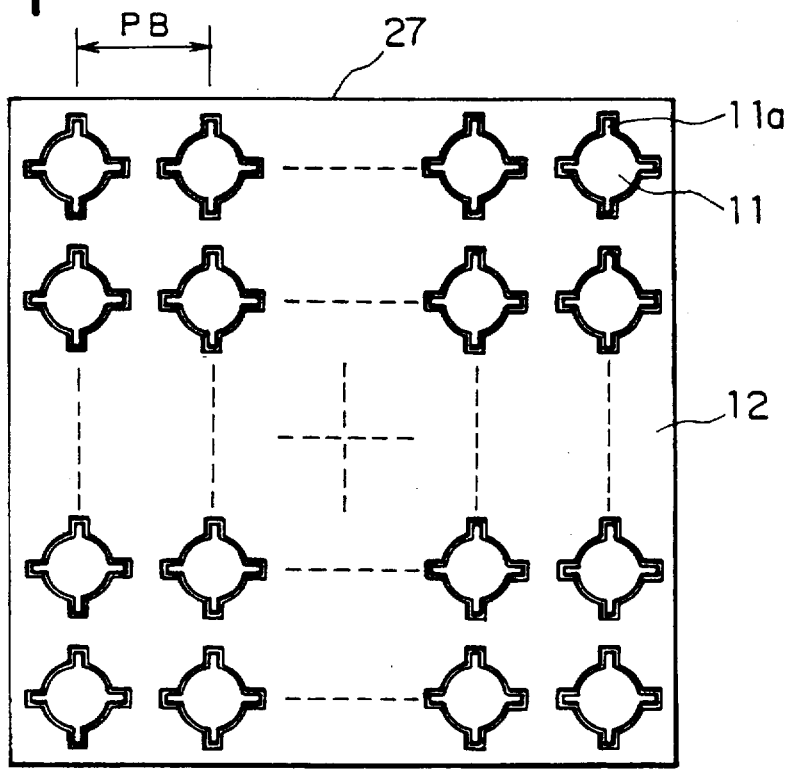
FIG. 1 is a schematic diagram showing a face of an evaluation board according to Embodiment 1 of the present invention.
Figure 2:
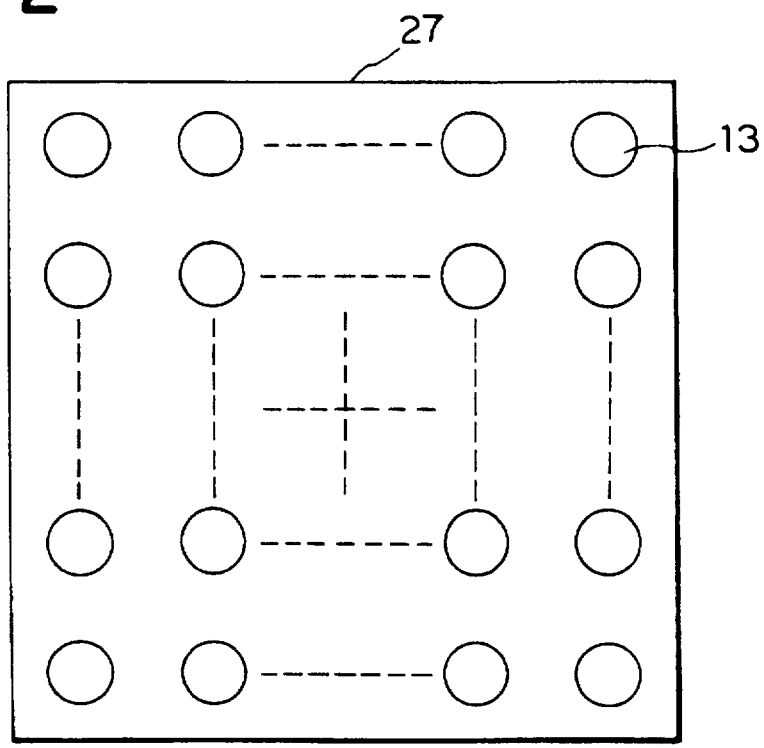
FIG. 2 is a schematic diagram showing a back face of an evaluation board according to Embodiment 1 of the present invention.
Figure 3:
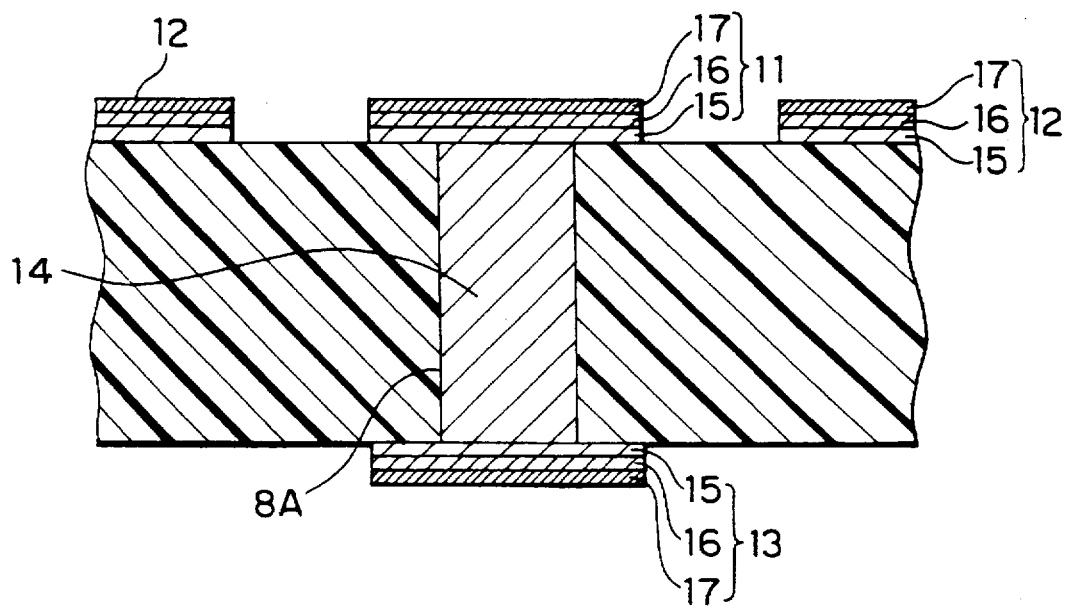
FIG. 3 is a cross-sectional view showing an evaluation board according to Embodiment 1 of the present invention.

Embodiment 1 of the present invention will hereinafter be explained with reference to FIG. 1 through FIG. 4. FIG. 1 shows a face of an evaluation board (test board) 27 for evaluating electrical characteristics, FIG. 2 shows its back face, and FIG. 3 shows a part of its cross-section. In FIG. 1, the reference numeral 11 shows a signal wire pattern for measurement. A plurality of signal wire patterns are arranged in a rectangular array with a plurality of parallel rows and columns at a pitch PB of 1.27 mm, each of which has a body and convex portion 11a, i.e., projections extending from the body in four directions. In addition, the length of this convex portion 11a is nearly 150–200 µm, and its width is various, but usually, nearly 100–200 µm. Furthermore, the reference numeral 12 shows a ground pattern for measurement, which is a widespread pattern having predetermined gaps (usually 50–100 µm) with signal wire patterns 11.

In FIG. 2, the reference numeral 13 shows a mounting portion in the form of a pad for package mounting connected to the signal wire pattern 11 through a through-hole electrically, and a plurality of pads are arranged in a rectangular array with a plurality of parallel rows and columns.

As shown in FIG. 3, in this embodiment, a filler material comprising an electroconductive material such as tungsten, copper, or the like is plugged in through-holes 8A to form plugged portions 14. Further, regarding the back face of this embodiment, the above-described pad 13 for package mounting is formed on these plugged portions 14.

That is, the test board 27 according to Embodiment 1 of the present invention comprises: signal wire patterns 11, which are formed in array and each of which has four convex portions; a ground pattern 12 that is formed around these signal wire patterns 11; pads 13 for package mounting that are formed in array; and through-holes 8A for connecting the signal wire patterns 11 and pads 13 for package mounting with plugged electroconductive materials electrically.

Next, an example of a method for producing a test board 27 according to this embodiment will be described with reference to FIG. 3. First of all, round through-holes are formed in array in a ceramic support board, which is under the state of a green sheet, by punching and the like. In this time, the diameter of each through-hole is nearly 0.2–7.0 mm. Subsequently, plugged portions 14 are formed by plugging these through-holes with electroconductive materials such as tungsten, copper or the like. After that, the ceramic support board is calcined and both sides of the ceramic board are polished. An electroconductive material 15 such as tungsten, copper or the like is evaporated on both sides of the ceramic support board, nickel 16, gold 17 and the like are sequentially evaporated to form the signal wire patterns 11, a ground pattern 12, and pads 13 for package mounting respectively. The specification for this evaporation is to select the materials having strong solder-resistivity. Finally, exposure and etching are performed to form patterns. In this time, the thickness of the above-described ceramic support board is less than or equal to 1 mm. The through-holes 8A, in which the plugged portions 14 are formed, connect the signal wire patterns 11 to the pads 13 for package mounting electrically.

Figure 4:
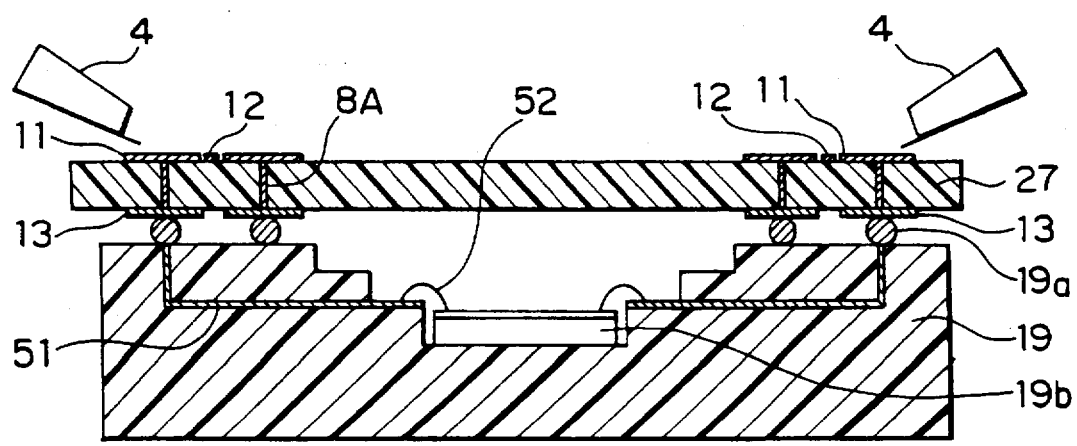
FIG. 4 is a cross-sectional view showing usage of Embodiment 1 of the present invention.

Next, usage of the test board 27 produced with this method will be explained with reference to FIG. 4. As shown in FIG. 4, a BGA package 19 has a microstrip board 19b that has patterns formed on a ceramic board and the like and has resistance of nearly 50 Ω and solder balls (external terminals) 19a arrayed at a pitch of 1.0–2.54 mm for electrical connection. In addition, in this embodiment, pads 13 for package mounting are formed in array on the plugged portion 14 of the test board 27.

At the time of measurement, first of all, by electrically connecting pads 13-arrayed on the back face of the test board 27 to all or desired solder balls 19a of the BGA package 19, the BGA package 19 is mounted. In that time, in the BGA package 19, in order to measure its electrical characteristics (reflection, transmission, and high-frequency characteristics and the like), the microstrip board 19b whose electrical characteristics are known beforehand is connected to wiring 51 on the BGA package with gold or aluminum wires 52.

On the face of the test board 27, signal wire patterns 11 electrically connected to a ground terminal, which is not shown, of the BGA package 19 through a part of solder balls 19a and pads 13 are connected to a ground pattern 12, which is a widespread pattern, with electroconductive materials such as solder or silver solder. Then, a head of a probe terminal 4 for measuring electrical characteristics is contacted to a convex portion 11a of the predetermined signal wire patterns 11 connected to the signal lines inside the BGA package 19 to be evaluated, and the ground pattern 12, which is a widespread pattern and adjacent to the convex portions. Thereby, the electrical characteristics (reelection and transmission characteristics and the like) of the BGA package 19 can be evaluated. For example, when the transmission characteristics of the BGA package 19 are measured, in FIG. 4, the left probe terminal 4 that is set as an input terminal is connected to the right probe terminal 4 that is set as an output terminal. In addition, the left and right terminals 4 can be exchanged each other. It is possible to use only one probe terminal 4 for measuring other electrical characteristics.

Figure 17:
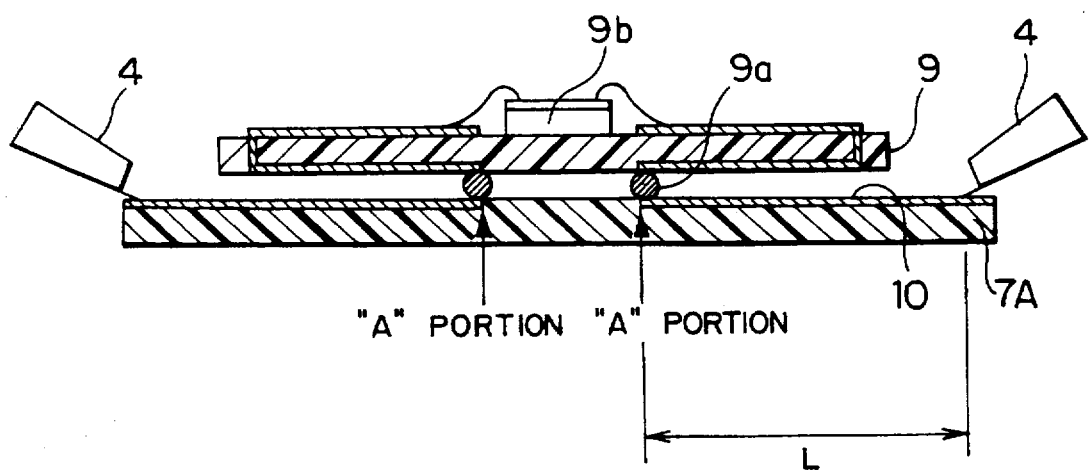
FIG. 17 is a cross-sectional view showing another conventional evaluation board in use.
Figure 18:
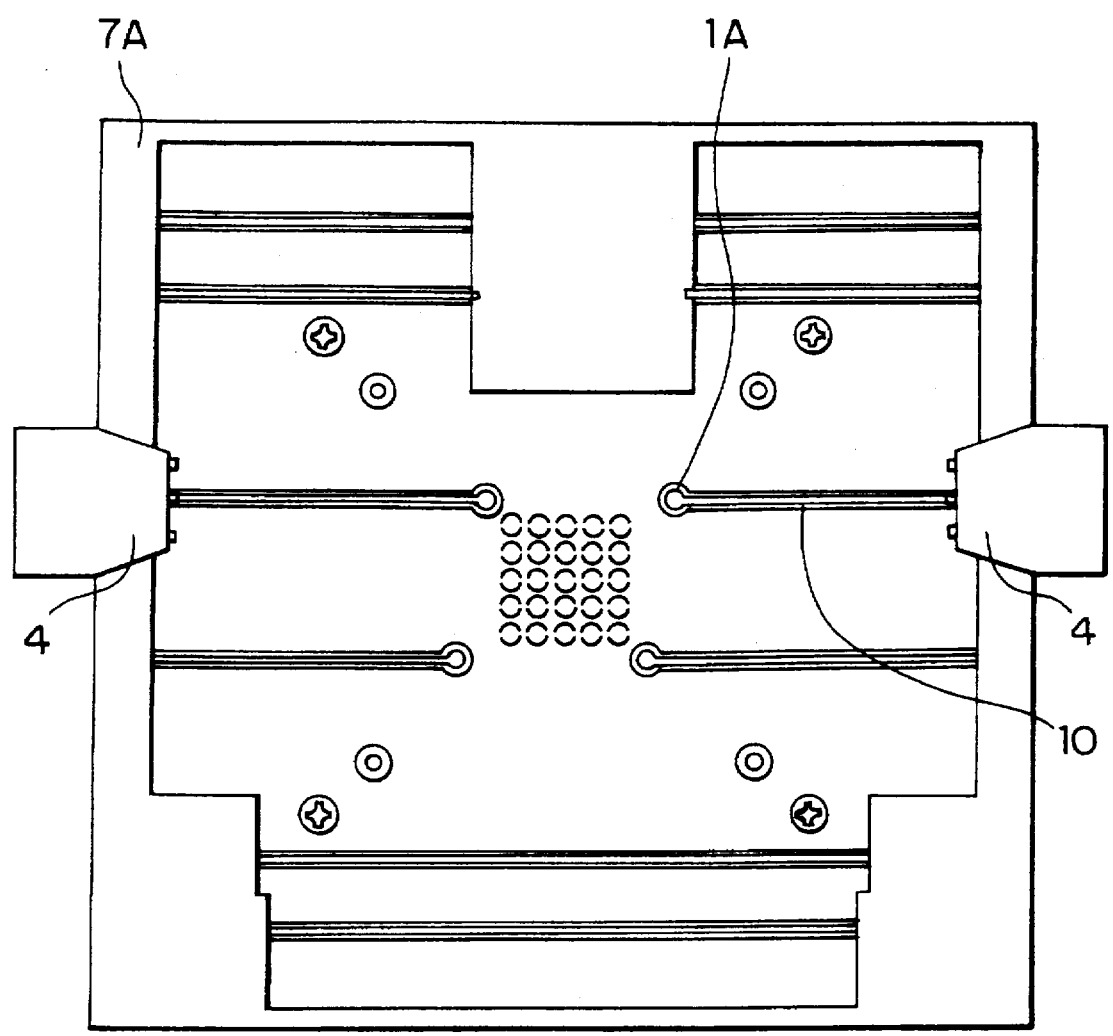
FIG. 18 is a top view showing another conventional evaluation board in use.

In this manner, heretofore, surface mount packages such as a BGA package 19, which has not insertion terminals and whose characteristics cannot be easily measured, can be easily measured. That is, heretofore, in case of measuring a package such as a BGA package 9 having no insertion terminal as shown in FIG. 17, it is necessary to mount the BGA package 9 on a measurement pattern side of a test board. Accordingly, the distance L between the solder ball 9A on the BGA package 9 and the contact portion of the head tip of the probe terminal 4 becomes long. Therefore, only TRL calibration that has many measurement errors can be applied.

However, according to this embodiment, a BGA package 19 can be mounted on the back face of a test board, and the thickness of the board (length of a plugged portion) is nearly 0.5–1.0 mm. Therefore, simply by calibrating at the head tip of a probe terminal 4 with LRM calibration, almost pure electrical characteristics of the BGA package 19 can be measured.

That is, according to this embodiment, also in the view point of measurement precision, the length of the through-hole 8A (plugged portion 14) is very short in comparison to the wiring pattern length on the BGA package 19, and hence it can be disregarded (in order to cancel the error, the characteristics of the through-hole 8A are subtracted). Since the LRM calibration adopted in this case uses a market-available impedance standard, accurate and highly-precisional calibration can be performed in comparison to the conventional TRL calibration.

In addition, in this embodiment, since electroconductive materials are plugged into the through-holes 8A in the test board 27, connecting materials do not protrude out of the surface of the test board if a package to be measured is mounted on the back face of the test board with the connecting materials such as solder. Therefore, it can be avoided that the connecting materials protrude out of the surface of the test board to prevent the probe 4 for measuring electrical characteristics probing.

Figure 14:
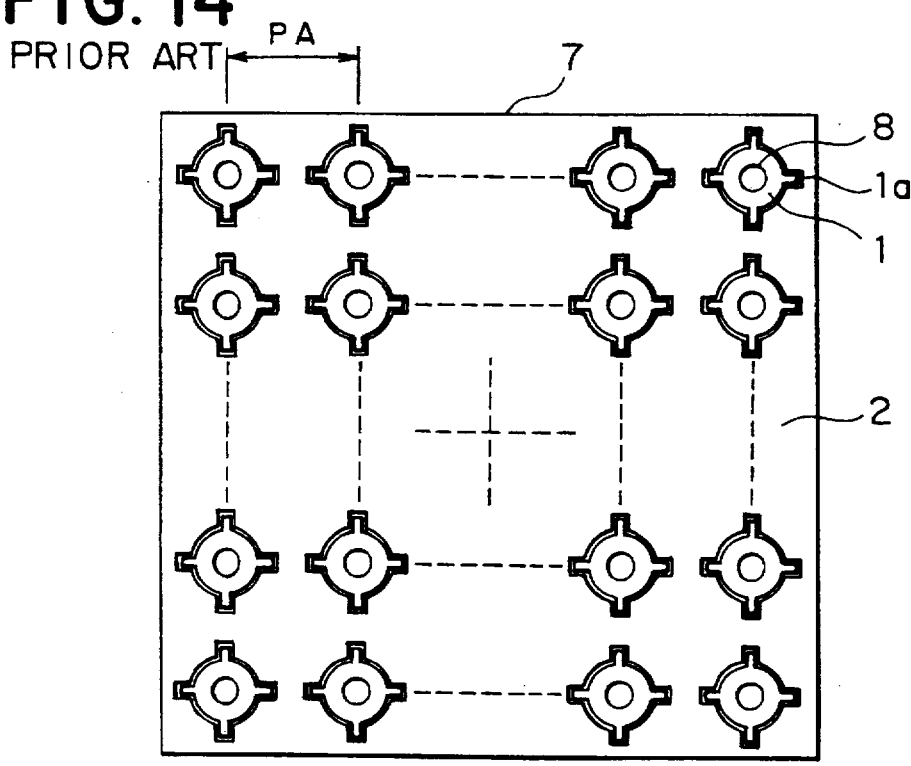
FIG. 14 is a schematic diagram showing a face of a conventional evaluation board.
Figure 15:
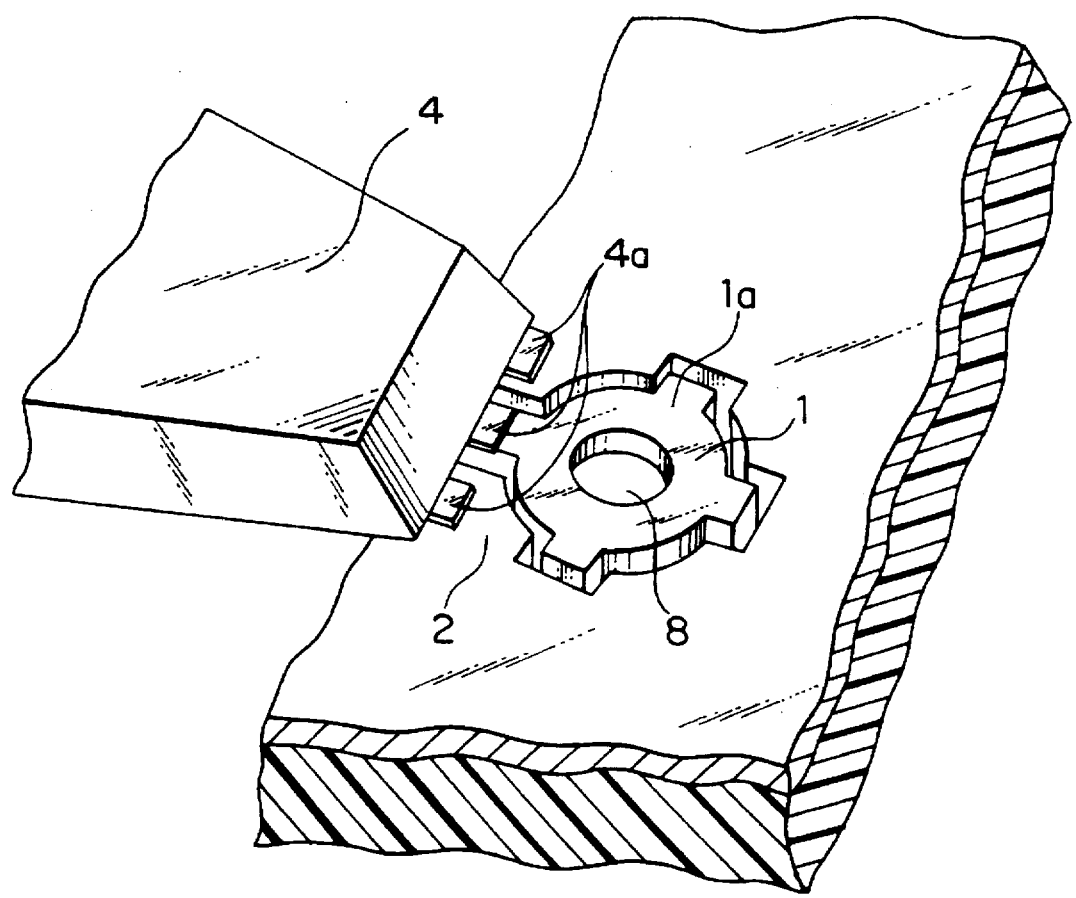
FIG. 15 is a perspective view showing a probing state at the time of conventional evaluation of electrical characteristics.
Figure 16:
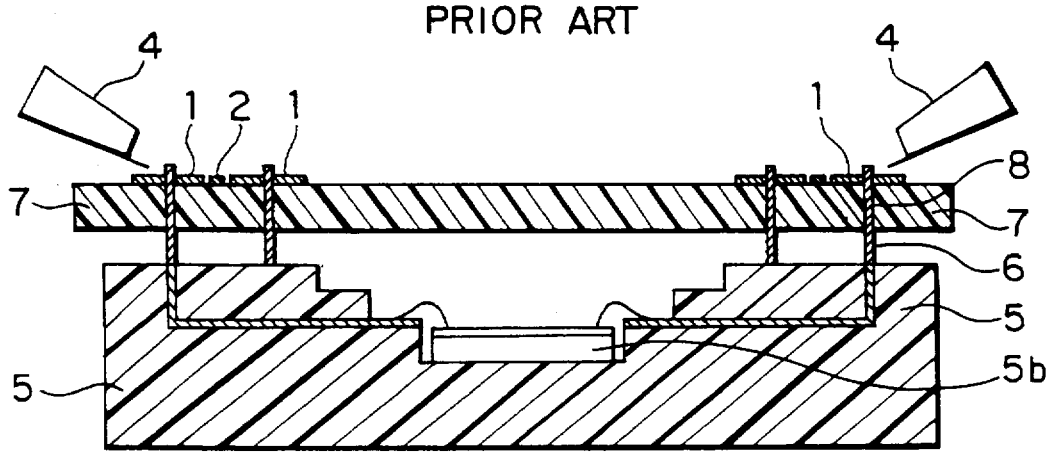
FIG. 16 is a cross-sectional view showing a conventional evaluation board in use.

Furthermore, on the back face of the board according to this embodiment, pads 13 for package mounting are formed on the above-described plugged through-holes 8A. Therefore, it is possible to obtain an effect that it becomes possible to arrange the pads 13 for package mounting in high density in comparison to a conventional example shown in FIG. 14, and it becomes easy to correspond to pitch-narrowing of external terminals of a package to be measured. Thus, since pins are not inserted, it is possible to form through-holes 8A with a small diameter in comparison to a conventional one, and hence it is possible to form pads 13 with a small diameter to form the pads 13 at a narrow pitch. On the signal wire patterns 11 in the opposite side, effects are the same as these.

In addition, in this embodiment, since patterns on the face and the back of a test board are arrayed, this embodiment can correspond from a multiple-pin package to a few-pin package by providing the number of patterns, which are more than usual, beforehand.

Furthermore, in this embodiment, if pitches of external terminals of packages are same, not only a BGA package but also a QFP (Quad Flat Package), TSO (Thin Small Outline Package), and the like can be measured on their electrical characteristics.

Embodiment 2

Figure 5:
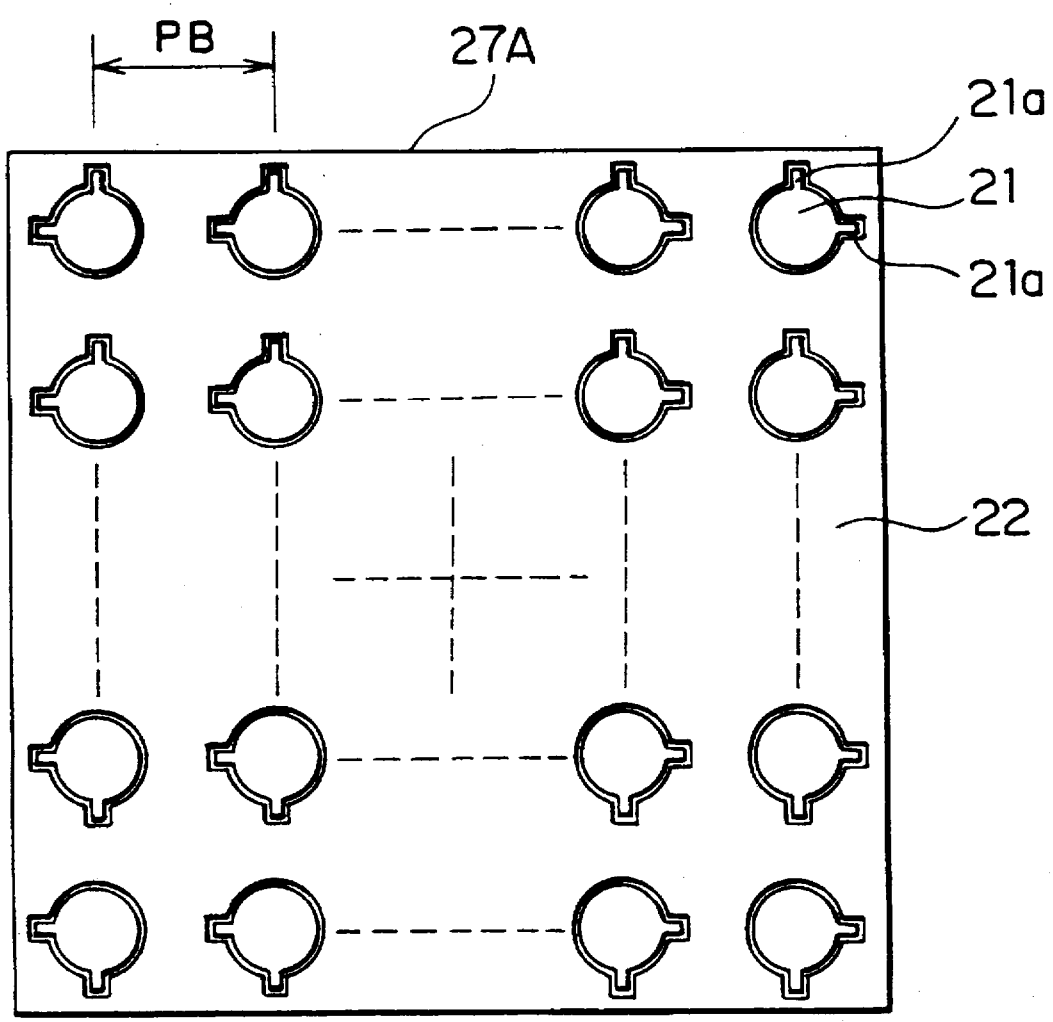
FIG. 5 is a schematic diagram showing a face of an evaluation board according to Embodiment 2 of the present invention.
Figure 6:
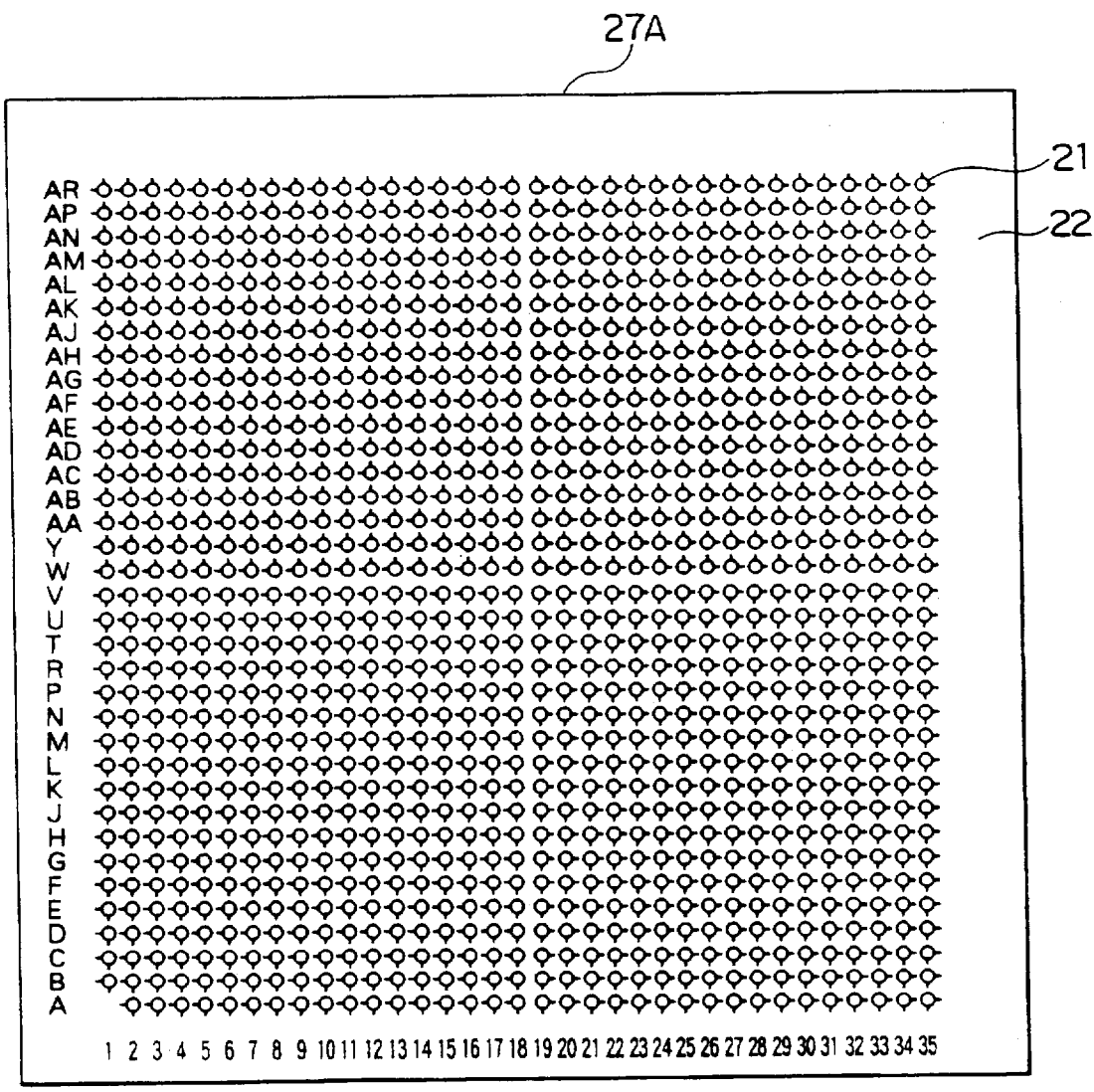
FIG. 6 is a schematic diagram showing a face of an evaluation board according to Embodiment 2 of the present invention.
Figure 7:
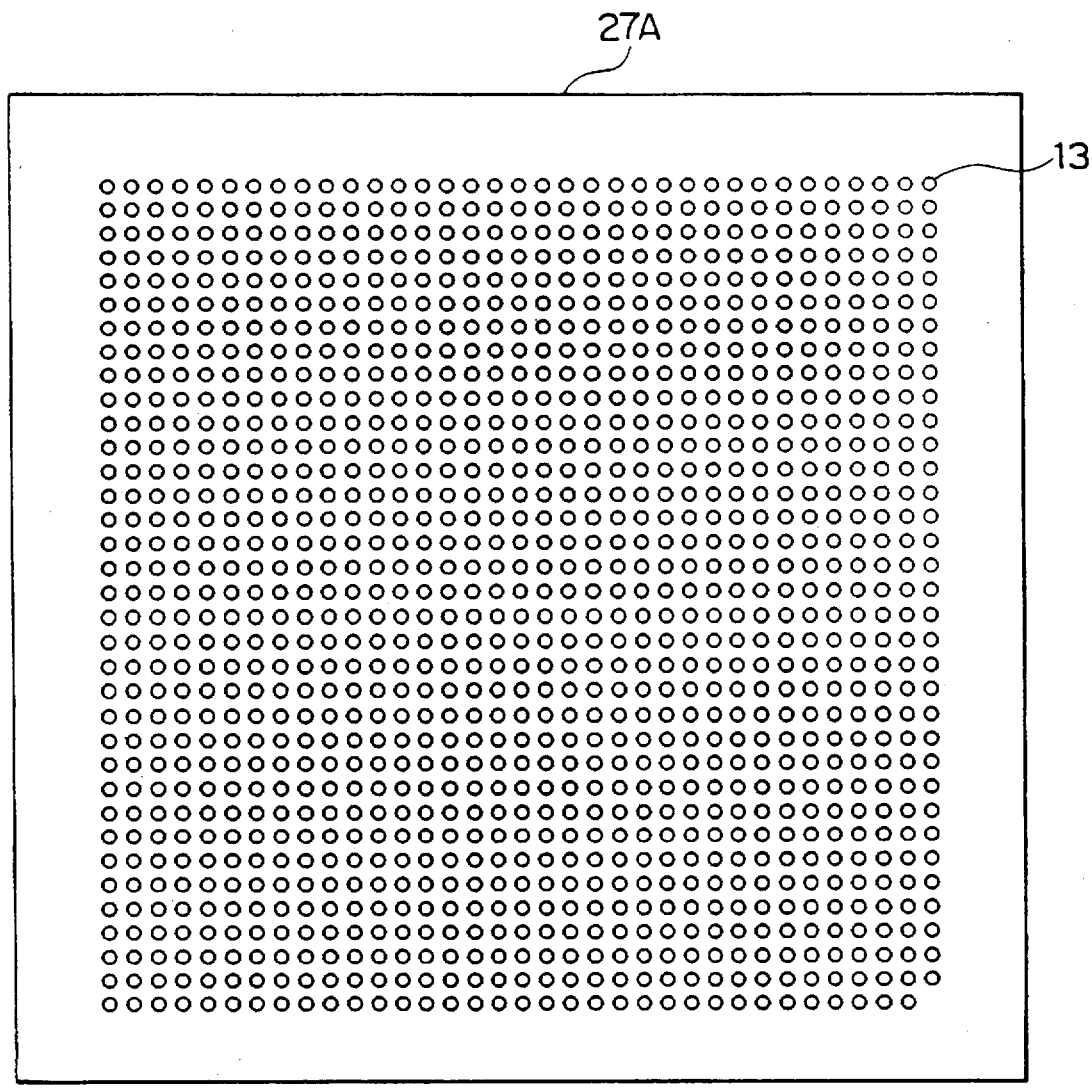
FIG. 7 is a schematic diagram showing a back face of an evaluation board according to Embodiment 2 of the present invention.

Next, Embodiment 2 of the present invention will be explained with reference to FIG. 5 through FIG. 7. FIG. 5 shows a face of an evaluation board 27A according to Embodiment 2. The back face of the board is the same as Embodiment 1 shown in FIG. 2. In this Embodiment 2, as shown in FIG. 5, convex portions 21a of each signal wire pattern 21 for contacting of probe terminals, are formed so as to extend toward only two specific directions, not four directions. In particular, in this Embodiment 2, the two directions toward which the convex portions 21a of each signal wire pattern 21 extend are directions as the signal wire pattern 11 becomes comparatively near to two edges among four edges of the board, and are perpendicular to these two edges. Further, the length of each convex portion 21a is nearly 150–200 μm, and the width is various, but usually nearly 50–200 μm. The reference numeral 22 shows a pattern used as a ground, which is a widespread pattern having predetermined gaps (usually 50–100 μm) with the signal wire patterns 21. On the back face of this Embodiment 2, as shown in FIG. 2, the pads for package mounting are arrayed, the pads which are connected to the signal wire patterns 21 through through-holes electrically, and which are formed on plugged portions 14 composed of plugged through-holes. A production method and usage of the evaluation board 27A are the same as those in Embodiment 1. In addition, the whole face pattern of the evaluation board according to this Embodiment 2 is shown in FIG. 6, and the back pattern is in FIG. 7.

That is, a test board 27A according to Embodiment 2 of the present invention comprises: signal wire patterns 21, which are formed on the face of the test board 27A and each of which has two convex portions 21a; a ground pattern 22 formed around these signal wire patterns 21; pads 13 for package mounting formed in array on the back face of the test board 27A; and through-holes 8A for connecting the signal wire patterns 21 to the pads for package mounting with plugged materials electrically.

According to this Embodiment 2, in addition to effects by above-described Embodiment 1, special effects can be obtained as follows. That is, since convex portions 21a of each signal wire pattern 21 are formed only in two specific directions, in comparison to the case that the convex portions are formed in four directions as usual, an area occupied by the whole signal wire patterns 21 can be reduced. Consequently, since signal wire patterns 21 and pads 13 can be arrayed at a narrow pitch, a package having external terminals in further high density can be measured.

In addition, especially in this Embodiment 2, the two directions toward which the convex portions 21a of a signal wire pattern 21 extend are directions as the signal wire pattern 11 becomes comparatively near to two edges among four edges of the test board, and are perpendicular to these two edges. Therefore, when a head tip of a probe terminal 4 is made to approach to a convex portion 21a for contact, it can be done from an outside edge of the test board, and hence approach and contact of the head tip of the probe terminal 4 become easy. Furthermore, there is hardly a problem if the number of the convex portions for contact of the head tip of the probe terminal 4 is reduced from four to two.

Embodiment 3

Figure 8:
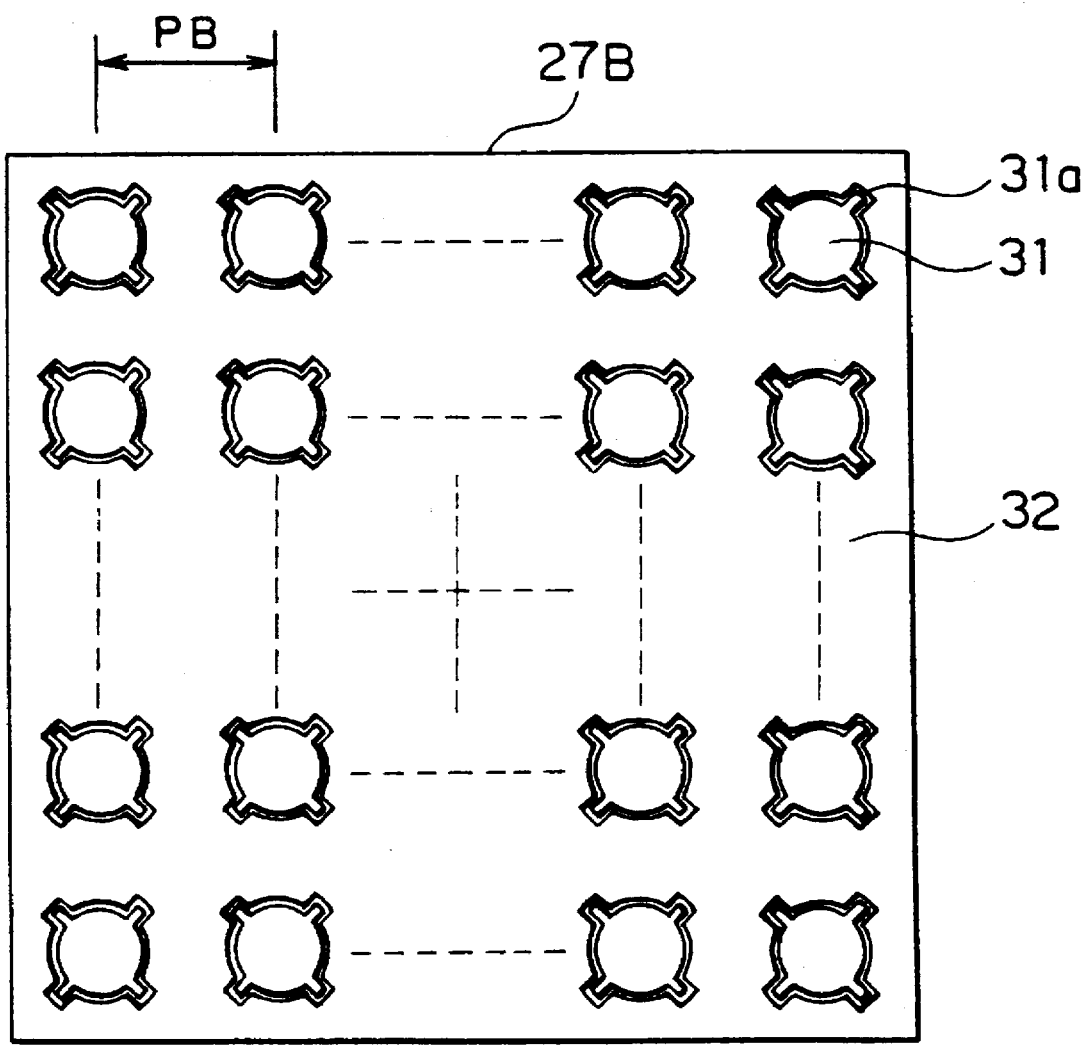
FIG. 8 is a schematic diagram showing a face of an evaluation board according to Embodiment 3 of the present invention.

Next, Embodiment 3 according to the present invention will be explained with reference to FIG. 8. FIG. 8 shows the face of an evaluation board 27B according to Embodiment 3. The back face is the same as that in above-described Embodiment 1. In FIG. 8, each signal wire pattern 31 has convex portions 31a in four directions, each of the convex portions extends toward the direction forming an angle in the range of 30°–60° with an edge of the board. In particular, in this Embodiment 3, each of four convex portions is formed in the direction forming an angle of 45° with an edge of the board. Further, the length of each convex portion 31a is nearly 150–200 μm, and the width is various, but usually nearly 50–200 μm. The reference numeral 32 shows a pattern used as a ground, which is a widespread pattern having predetermined gaps (usually 50–100 μm) with the signal wire patterns 31. The constitution of the back face, production method, and usage of the board according to this Embodiment 2 are the same as those in above-described Embodiment 1.

That is, a test board 27B according to Embodiment 3 of the present invention comprises: signal wire patterns 31, which are formed on the face of the test board 27B and each of which has four convex portions 31a; a ground pattern 32 formed around these signal wire patterns 31; pads 13 for package mounting formed in array on the back face of the test board 27B; and through-holes 8A for connecting the signal wire patterns 31 to the pads 13 for package mounting with plugged materials electrically.

According to this Embodiment 3, in addition to effects by above-described Embodiment 1, special effects can be obtained as follows. That is, since each of convex portions 31a of the signal wire patterns 31 is formed so as to form a predetermined angle with an edge of the board, in comparison to the case that each convex portion is formed without an angle, a pitch PB of the array can be reduced in spite of having four convex portions. Therefore, a pitch of 1.27 mm, or further 1.0 mm can be attained.

Embodiment 4

Figure 9:
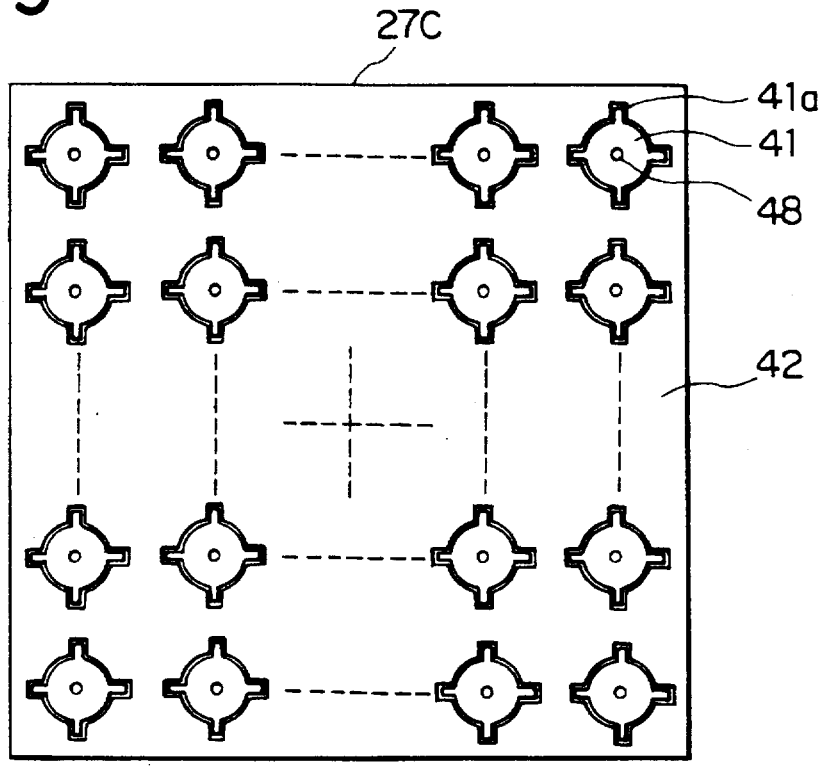
FIG. 9 is a schematic diagram showing a face of an evaluation board according to Embodiment 4 of the present invention.
Figure 10:
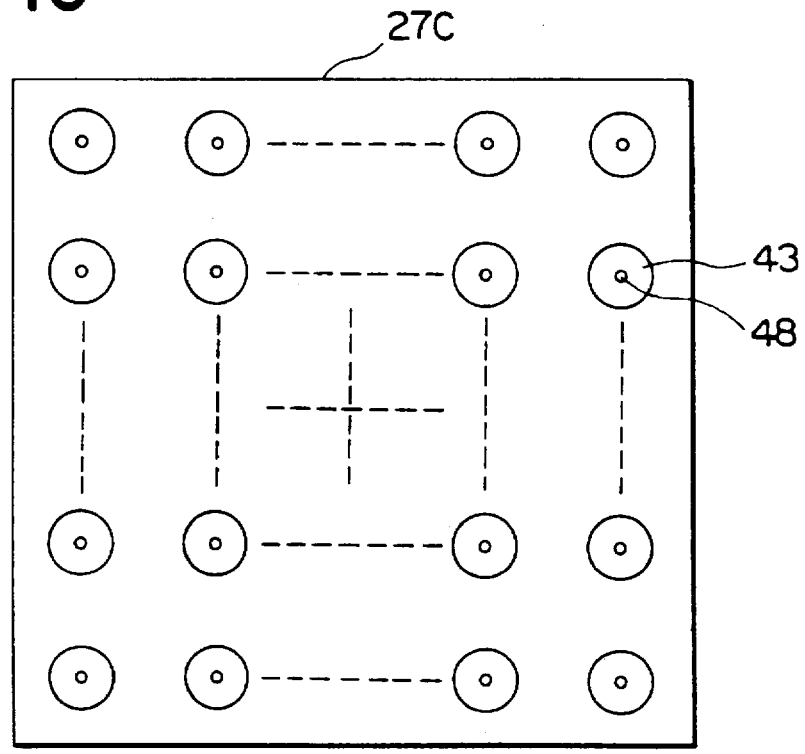
FIG. 10 is a schematic diagram showing a back face of an evaluation board according to Embodiment 4 of the present invention.
Figure 11:
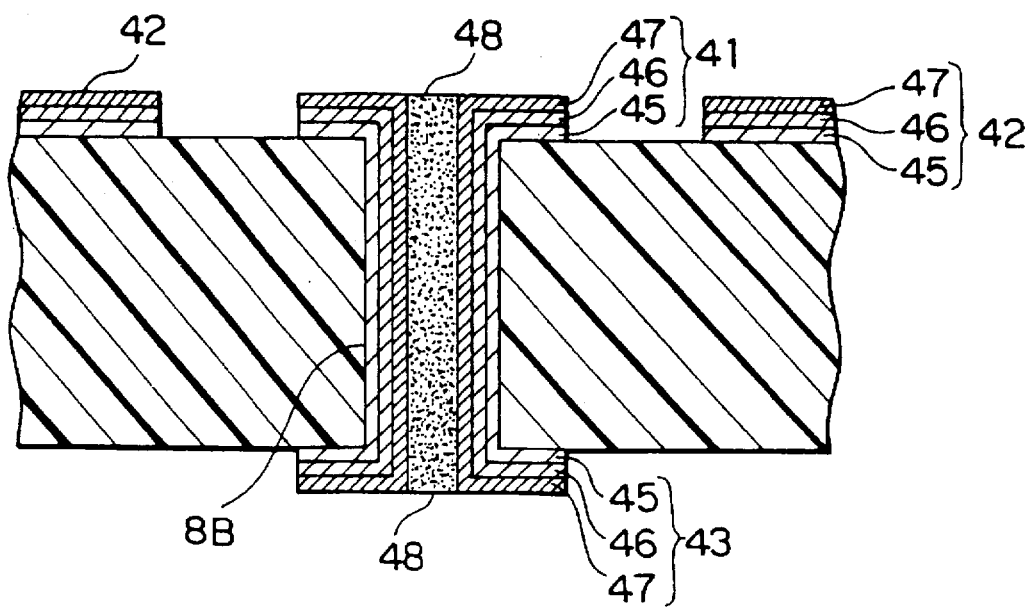
FIG. 11 is a cross-sectional view showing an evaluation board according to Embodiment 4 of the present invention.
Figure 12:
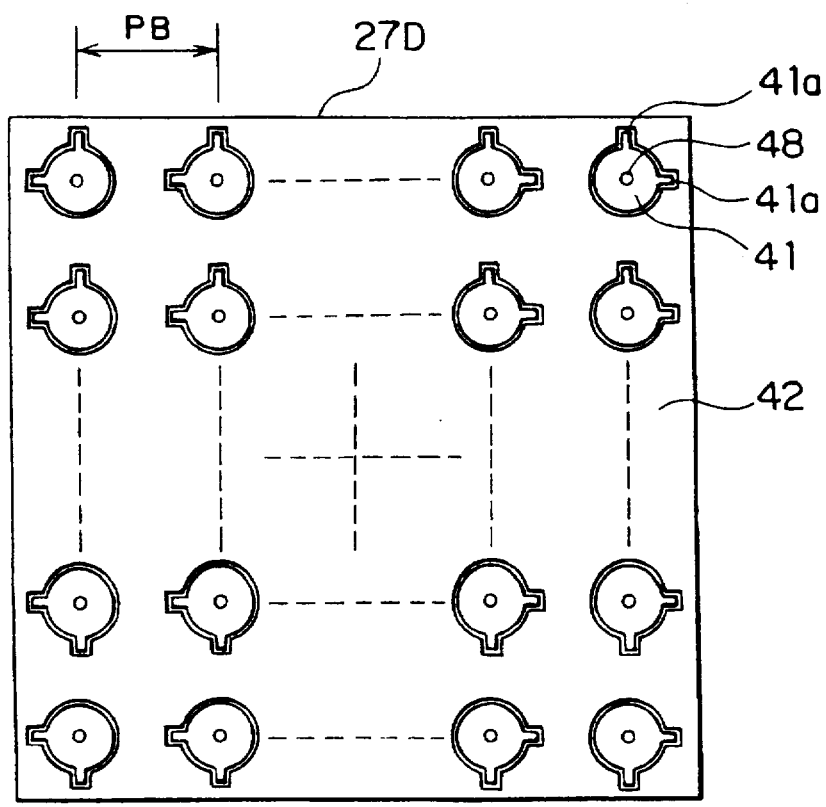
FIG. 12 is a schematic diagram showing a face of another evaluation board according to Embodiment 4 of the present invention.

Embodiment 4 of the present invention will hereinafter be explained with reference to FIG. 9 through FIG. 11. FIG. 9 shows a face of an evaluation board 27C, FIG. 10 shows its back face, and FIG. 11 shows a part of its cross-section. In FIG. 9, the reference numeral 41 shows a signal wire pattern for measurement, which has convex portions in four directions. In addition, the length of this convex portion 41a is nearly 150–200 μm, and its width is various, but usually, nearly 50–200 μm. Furthermore, the reference numeral 42 shows a ground pattern, which is a widespread pattern having predetermined gaps (usually 50–100 μm) with signal wire patterns 41.

In FIG. 10, the reference numeral 43 shows a pad connected to the signal wire pattern 41 through a through-hole electrically, and a plurality of pads is arrayed.

That is, the test board 27C according to Embodiment 4 of the present invention comprises: signal wire patterns 41, which are formed in array and each of which has four convex portions; a ground pattern 42 that is formed around these signal wire patterns 41; pads 43 for package mounting that are formed in array on the back face of the board, and through-holes 8B for connecting the signal wire patterns 41 to pads 43 for package mounting with plugged electroconductive materials or insulating materials electrically.

Next, an example of a method for producing a test board 27C according to this embodiment will be described with reference to FIG. 11. First of all, round through-holes are formed in array in a ceramic support board that is under the state of a green sheet, a glass-epoxy support board, and the like by punching and the like. In this time, the diameter of each through-hole is nearly 0.2–1.0 mm. Subsequently, the board is calcined and both sides of the board are polished. An electroconductive material 45 such as tungsten, copper or the like is evaporated on both sides of the board and walls of the through-holes, and next, nickel 46, gold 47 and the like are sequentially evaporated. The specification for this evaporation is to select the materials having strong solder-resistivity. Subsequently, exposure and etching are performed to form patterns. Finally, the through-holes whose walls are metalized are plugged with thermal-resistive insulating materials or electroconductive materials 48. In this time, the thickness of the board is less than or equal to 1 mm. In this manner, in the production method of this Embodiment 4, the through-holes are plugged with insulating materials or electroconductive materials after pattern formation. Therefore, in comparison to the production method of Embodiment 1, the selection range of plugged materials is wide. With through-holes 8B, which have walls metalized with laminated metals and are plugged with insulating materials or electroconductive materials 48, the signal wire patterns 41 are connected to the pads 43 for package mounting electrically.

In addition, in this Embodiment 4, although each projection 41a of the signal wire patterns 41 are extending toward four directions, each projection can be formed so as to protrude toward only two directions.

Figure 13:
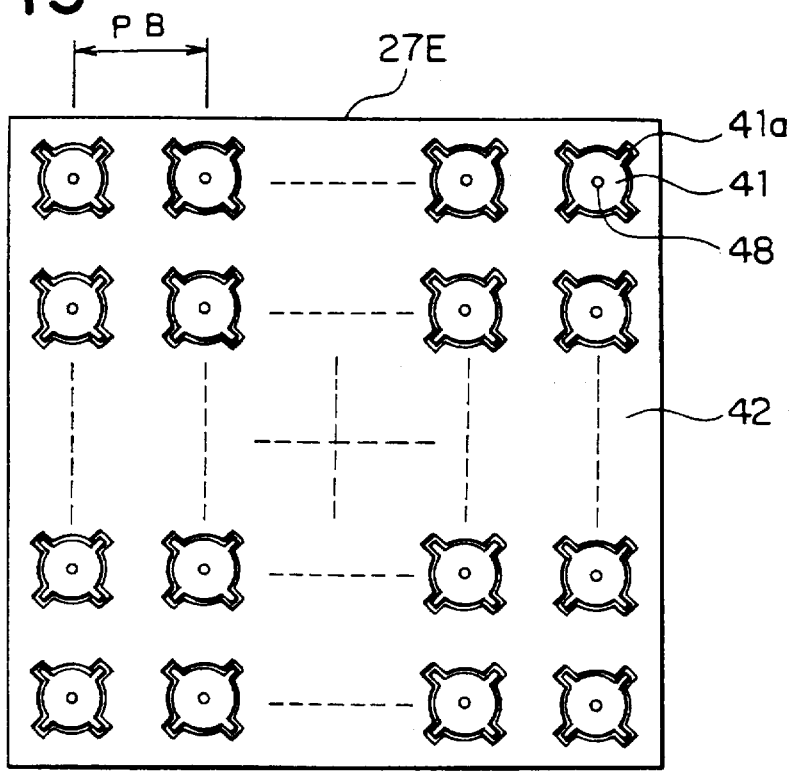
FIG. 13 is a schematic diagram showing a face of another evaluation board according to Embodiment 4 of the present invention.

In the other aspect, as shown in FIG. 13, the projections can be formed so that each of the convex portions protrudes toward the direction forming a predetermined angle with an edge of the board.

By means of that, effects of not only Embodiment 4 but also Embodiment 2 and Embodiment 3 can be obtained, and hence correspondence to measurement of a package with a further narrow pitch becomes easy.

What is claimed is:

1. An evaluation board for measuring electrical characteristics of an IC package comprising:

a support board having first and second principal surfaces;

a plurality of electrically conducting signal wire patterns for contact by a measurement probe formed on the first principal surface;

a plurality of mounting portions for contact with an IC package formed on the second principal surface, each mounting portion being electrically connected through the support board to one of the signal wire patterns; and an electrically conducting ground pattern formed on the first principal surface and spaced from and completely surrounding a periphery of each signal wire pattern.

2. An evaluation board according to claim 1 wherein the support board includes a plurality of through-holes each extending between one of the signal wire patterns and one of the mounting portions and containing an electroconductive material electrically connecting one of the signal wire patterns and one of the mounting portions.

3. An evaluation board according to claim 1 wherein the signal wire patterns and the mounting portions are each arranged in an array.

4. An evaluation board according to claim 1 wherein each array comprises a plurality of parallel rows and a plurality of parallel columns.

5. An evaluation board for measuring electrical characteristics of an IC package comprising:

a support board having first and second principal surfaces;

a plurality of electrically conducting signal wire patterns for contact by a measurement probe formed on the first principal surface, each of the signal wires comprising a body and a plurality of projections connected to and extending away from the body;

a plurality of mounting portions for contact with an IC package formed on the second principal surface, each mounting portion being electrically connected through the support board to one of the signal wire patterns; and an electrically conducting ground pattern formed on the first principal surface around the signal wire patterns.

6. An evaluation board according to claim 5 wherein the support board is rectangular with four sides, and each of the signal wire patterns has four projections each extending perpendicularly to one of the four sides.

7. An evaluation board according to claim 5 wherein the support board is rectangular with four sides, and each signal wire pattern has only two projections, the projections extending towards and perpendicular to two closest sides of the four sides of the support board.

8. An evaluation board according to claim 5 wherein the support board is rectangular with four sides, and each of the projections extends nonperpendicularly with respect to the sides of the support board.

9. An evaluation board for measuring electrical characteristics of an IC package comprising:

a support board having first and second principal surfaces and a plurality of through holes formed between the first and second principal surfaces;

a plurality of electrically conducting signal wire patterns for contact by a measurement probe formed on the first principal surface, each of the signal wire patterns comprising a plurality of laminated metal layers;

a plurality of mounting portions for contact with an IC package formed on the second principal surface, each of the mounting portions comprising a plurality of laminated metal layers; and an electrically conducting ground pattern formed on the first principal surface around the signal wire patterns, each of the through holes containing a filler material and a plurality of laminated metal layers surrounding the filler material, each of the layers in the through hole being electrically connected with one of the layers of one of the signal wire patterns and with one of the layers of one of the mounting portions.

10. An evaluation board for measuring electrical characteristics of an IC package comprising:

an electrically insulating support board having first and second principal surfaces;

a plurality of flat electrically conducting signal wire patterns for contact by a measurement probe formed atop the first principal surface; and a plurality of flat mounting pads for contact with solder balls of an IC package formed atop the second principal surface, each of the mounting pads being electrically connected to one of the signal wire patterns through the support board.

11. An evaluation board as claimed in claim 10 wherein the mounting pads are formed on the second principal surface by etching.

12. An evaluation board as claimed in claim 10 including an electrically conducting ground pattern formed on the first principal surface around the signal wire patterns.

* * * * *